United States Patent
Gupta et al.

(10) Patent No.: US 9,252,774 B2
(45) Date of Patent: Feb. 2, 2016

(54) INTEGRATED CIRCUIT WAKE-UP CONTROL SYSTEM

(71) Applicants: Sunny Gupta, Noida (IN); Kumar Abhishek, Ghaziabad (IN); Nitin Pant, New Delhi (IN); Garima Sharda, Ghaziabad (IN)

(72) Inventors: Sunny Gupta, Noida (IN); Kumar Abhishek, Ghaziabad (IN); Nitin Pant, New Delhi (IN); Garima Sharda, Ghaziabad (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 345 days.

(21) Appl. No.: 13/902,872

(22) Filed: May 27, 2013

(65) Prior Publication Data

US 2014/0351615 A1 Nov. 27, 2014

(51) Int. Cl.
*G06F 1/26* (2006.01)
*H03K 19/00* (2006.01)
*G06F 1/32* (2006.01)

(52) U.S. Cl.
CPC ............. *H03K 19/0016* (2013.01); *G06F 1/32* (2013.01); *G06F 1/26* (2013.01); *G06F 1/3287* (2013.01)

(58) Field of Classification Search
CPC ............ G06F 1/32; G06F 1/26; G06F 1/3287
See application file for complete search history.

(56) References Cited

U.S. PATENT DOCUMENTS

| | | | |
|---|---|---|---|
| 5,940,785 A * | 8/1999 | Georgiou et al. | 702/132 |
| 6,523,128 B1 * | 2/2003 | Stapleton et al. | 713/330 |
| 6,563,746 B2 | 5/2003 | Fujioka | |
| 6,886,105 B2 | 4/2005 | Kahn | |
| 7,583,104 B2 | 9/2009 | Simmons | |
| 7,593,455 B2 | 9/2009 | Son | |
| 7,729,192 B2 * | 6/2010 | Schoenfeld | 365/227 |
| 7,971,086 B2 * | 6/2011 | Itkin | 713/330 |
| 8,001,406 B2 | 8/2011 | Choi | |
| 2006/0101298 A1 | 5/2006 | Park | |
| 2008/0108318 A1 | 5/2008 | Min | |
| 2008/0162969 A1 | 7/2008 | Royannez | |
| 2009/0085545 A1 * | 4/2009 | Shen et al. | 323/283 |
| 2010/0064160 A1 | 3/2010 | Wilson | |
| 2010/0205467 A1 | 8/2010 | Park | |
| 2011/0006824 A1 | 1/2011 | Kang | |
| 2011/0158303 A1 | 6/2011 | Gauthier | |
| 2013/0147446 A1 * | 6/2013 | Kris et al. | 323/273 |
| 2014/0028278 A1 * | 1/2014 | Pedersen et al. | 323/304 |
| 2014/0203866 A1 * | 7/2014 | Sinha et al. | 327/540 |

FOREIGN PATENT DOCUMENTS

WO 2009078575 6/2009

* cited by examiner

*Primary Examiner* — Jaweed A Abbaszadeh
*Assistant Examiner* — Gary Collins
(74) *Attorney, Agent, or Firm* — Charles E. Bergere

(57) ABSTRACT

An integrated circuit (IC) that operates in high and low power modes includes high and low power regulators, first and second sets of circuits, a switch connecting the high power regulator and the second set of circuits, and a wake-up control system. The wake-up control system includes a state machine that enables the high power regulator when the IC is in the high power mode, and enables the low power regulator when the IC is in the low power mode. The switch is closed when the high power regulator reaches a first threshold voltage. The state machine operates on a low frequency clock signal when the IC is in the low power mode and during wake-up, and on a high frequency clock signal in the high power mode after the switch is closed.

18 Claims, 2 Drawing Sheets

INTEGRATED CIRCUIT WAKE-UP CONTROL SYSTEM

BACKGROUND OF THE INVENTION

The present invention relates generally to integrated circuits, and more particularly, to a control system for waking up a circuit from a sleep or low power mode.

Integrated circuits (IC) include power supplies that provide different supply voltages to internal circuits. ICs often operate in different power modes including RUN, STOP, and STANDBY modes. The RUN mode is a high power mode and the STOP and STANDBY modes are low power modes. A power supply further provides voltage regulation and includes a high power regulator (HPREG) for regulating the supply voltage during the RUN mode, a low power regulator (LPREG) for regulating the supply voltage during the STOP mode, and an ultra low power regulator (ULPREG) for regulating the supply voltage during the STANDBY mode.

Based on the mode of operation, the electrical components within an IC may be categorized as first and second sets of circuits. The first set of circuits includes core functional elements of the IC such as processors, memories and interface circuits and often occupies the majority of the IC area (up to 99% in many ICs). The first set of circuits is active when the IC is in the high power mode. The second set of circuits includes circuits that maintain basic timer functions, random access memory (RAM) and a wake-up state machine and occupies relatively lesser area (around 1%) of the IC. The second set of circuits is active throughout the operation of the IC, regardless of the mode of operation of the IC.

The first and second sets of circuits both operate on a regulated supply voltage received from the HPREG when the IC in the RUN mode, while the second set of circuits operates on a regulated supply voltage received from the LPREG and ULPREG when the IC is in the STOP and STANDBY modes, respectively.

The wake-up state machine operates on a clock signal and generates control signals for enabling transition of the IC from the low power mode to the high power mode. The higher the frequency of the clock signal, the faster the transition of the IC from the low power mode to the high power mode. However, a high frequency clock source consumes high power and draws a large current from the LPREG/ULPREG during transition of the IC from the low to high power mode.

The LPREG/ULPREG is designed for sustaining a low order current and often fails to sustain an increased current requirement of the high frequency clock source. When the IC wakes up from the low power mode, a sudden change in current load can create a low voltage event and cause the IC to undergo reset. A re-boot of the IC can affect the system state and may lead to loss of critical data and time. In systems such as automotive systems, system state is very important so it is preferred not to lose state due to frequent resets. A low frequency clock source prevents the IC from reset, however, it increases the overall time (wake-up time) taken by the IC to exit the low power mode and enter the high power mode, and also affects overall system performance.

An alternate way to prevent IC reset is to mask low voltage reset when the IC wakes up. However, this may result in masking low voltage conditions that occur due to conditions other than exit from low power mode, thereby causing the IC to function unreliably. Another way to prevent reset is to use a low power regulator that can sustain high current requirements of the high frequency clock source. However, using such a regulator may lead to high power loss in low power modes.

Therefore, there is a need for a wake-up control system that prevents an IC from a reset caused by increased load currents when the IC wakes up and transitions from low power mode to high power mode, and that overcomes the above-mentioned limitations of existing wake-up control systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
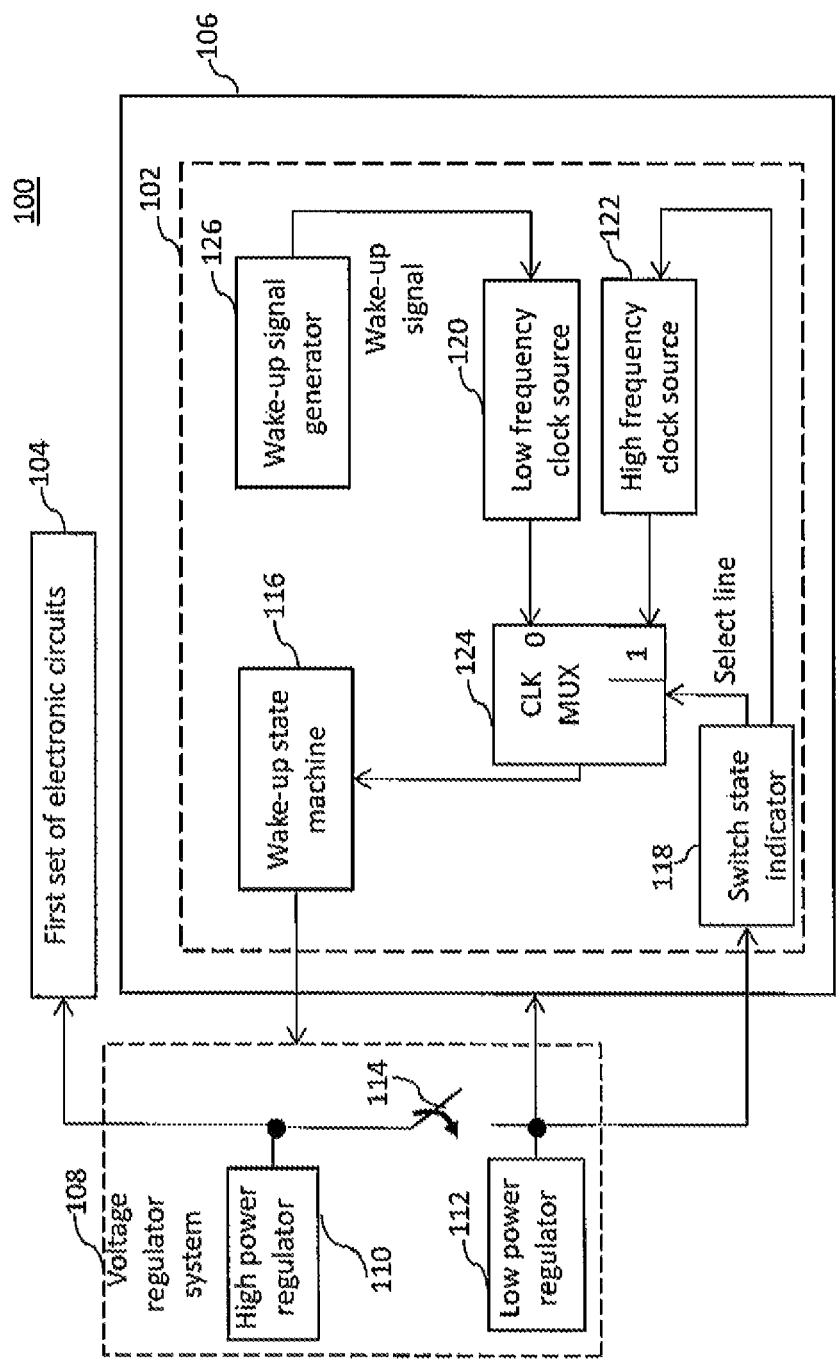
FIG. 1 is a schematic block diagram of an integrated circuit that includes a wake-up control system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit is provided that includes first and second sets of electronic circuits, high and low power regulators, and a switch. The high power regulator provides a first regulated supply voltage to the first and second sets of electronic circuits when the integrated circuit is in a high power mode, and is switched off when the integrated circuit is in a low power mode. The low power regulator provides a second regulated supply voltage to the second set of electronic circuits when the integrated circuit is in the low power mode, and is switched off when the integrated circuit is in the high power mode. The switch is connected between the high power regulator and the second set of electronic circuits, for connecting the high power regulator to the second set of electronic circuits when the integrated circuit is in the high power mode, and disconnecting the high power regulator and the second set of electronic circuits when the integrated circuit is in the low power mode. The second set of electronic circuits includes a wake-up control system, connected to the high and low power regulators and the switch. The wake-up control system includes a wake-up state machine that enables the high power regulator when the integrated circuit transitions from the low power mode in to the high power mode, and enables the switch to connect the high power regulator to the second set of electronic circuits, when the high power regulator reaches a first threshold voltage. The wake-up state machine operates on a low frequency clock signal when the integrated circuit transitions from the low power mode to the high power mode and the switch is open, and operates on a high frequency clock signal when the switch is closed.

In another embodiment of the present invention, an integrated circuit is provided that includes first and second sets of electronic circuits, high and low power regulators, and a switch. The high power regulator provides a first regulated supply voltage to the first and second sets of electronic circuits, when the integrated circuit is in a high power mode, and is switched off when the integrated circuit is in a low power mode. The low power regulator provides a second regulated supply voltage to the second set of electronic circuits when the integrated circuit is in the low power mode, and is switched off when the integrated circuit is in the high power mode. The switch is connected between the high power regulator and the second set of electronic circuits, for connecting the high power regulator to the second set of electronic circuits when the integrated circuit is in the high power mode, and disconnecting the high power regulator and the second set of electronic circuits when the integrated circuit is in the low power mode. The second set of electronic circuits includes a wake-up control system, connected to the high and low power regulators and the switch. The wake-up control system includes a wake-up state machine, a high frequency clock source for generating a high frequency clock signal, a low frequency clock source for generating a low frequency clock signal, a switch state indicator connected to the switch for indicating whether the switch is open or closed and further connected to the high frequency clock source for enabling the high frequency clock source when the switch is closed, a clock multiplexer, and a wake-up signal generator. The wake-up state machine enables the high power regulator when the integrated circuit transitions from the low power mode in to the high power mode, and enables the switch to connect the high power regulator to the second set of electronic circuits when the high power regulator reaches a first threshold voltage. The wake-up state machine operates on the low frequency clock signal, when the integrated circuit transitions from the low power mode to the high power mode and the switch is open, and operates on the high frequency clock signal when the switch is closed. The clock multiplexer has a first input terminal connected to the low frequency clock source for receiving the low frequency clock signal, a second input terminal connected to the high frequency clock source for receiving the high frequency clock signal, a select terminal connected to the switch state indicator for receiving a current state of the switch, and an output terminal connected to the wake-up state machine. The clock multiplexer provides the low frequency clock signal to the wake-up state machine when the switch is open, and provides the high frequency clock signal to the wake-up state machine when the switch is closed. The wake-up signal generator is connected to the low frequency clock source, for generating a wake-up signal to enable the low frequency clock source when the integrated circuit transitions from the low power mode to the high power mode.

In yet another embodiment of the present invention, a wake-up control system of an integrated circuit is provided. The integrated circuit includes first and second sets of electronic circuits, high and low power regulators, and a switch connected between the high power regulator and the second set of electronic circuits. The wake-up control system is connected to the high power regulator, low power regulator and the switch. The wake-up control system comprises a wake-up state machine, that enables the high power regulator when the integrated circuit transitions from a low power mode in to a high power mode, and enables the switch to connect the high power regulator to the second set of electronic circuits when the high power regulator reaches a first threshold voltage, and wherein the wake-up state machine operates on a low frequency clock signal, when the integrated circuit transitions from the low power mode to the high power mode and the switch is open, and operates on a high frequency clock signal when the switch is closed.

Various embodiments of the present invention provide an integrated circuit that includes first and second set of electronic circuits, high and low power regulators, and a switch that connects the high power regulator and the second set of electronic circuits. The second set of electronic circuits include a wake-up control system and the wake-up control system includes a wake-up state machine that enables the high power regulator when the integrated circuit transitions from a low power mode in to a high power mode and enables the switch when the high power regulator reaches a first threshold voltage. The wake-up state machine operates on a low frequency clock signal when the switch is open (when the integrated circuit transitions from the low power mode into the high power mode) and operates on a high frequency clock signal when the switch is closed. After the switch is closed, the second set of electronic circuits receives the first regulated supply voltage from the high power regulator. The high power regulator can sustain the increased current requirement of the wake-up state machine and prevents the integrated circuit to from a reset. Further, the wake-up state machine operates on the low frequency clock signal for a relatively less amount of the overall time (wake-up time) taken by the integrated circuit to transition from the low power mode into the high power mode. Thus, the wake-up time of the integrated circuit is not significantly affected by operating the wake-up state machine on the low frequency clock signal, until the switch is closed.

Referring now to FIG. 1, a schematic block diagram of an integrated circuit (IC) 100 that includes a wake-up control system 102 in accordance with an embodiment of the present invention, is shown. Examples of the IC 100 may include a microcontroller unit (MCU), a system-on-chip (SoC), or an application specific integrated circuit (ASIC), and finds application in automotive systems. The IC 100 operates in RUN, STOP, and STANDBY modes. The RUN mode is a high power mode and the STOP and STANDBY modes are low power modes.

The IC 100 includes first and second sets of electronic circuits 104 and 106, which may be digital circuits, analog circuits, or a combination thereof (i.e., mixed signal circuits). The first set of electronic circuits 104 often includes core functional elements of the IC such as processors, memories and interface circuits, those which remain active when the IC 100 is in the high power mode. The second set of electronic circuits include circuits that maintain basic timer functions, random access memory (RAM) and the wake-up control system 102 and remains active throughout the operation of the IC 100, irrespective of the mode of operation of the IC 100.

A voltage regulator system 108 is connected to the first and second set of electronic circuits 104 and 106, and receives a supply voltage from a supply voltage source (not shown) of the IC 100, and provides a regulated supply voltage to the first and second set of electronic circuits 104 and 106 based on the mode of operation of the IC 100. The voltage regulator system 108 includes high and low power regulators (HPREG and LPREG) 110 and 112, and a switch 114. The HPREG 110 provides a first regulated supply voltage to the first and second sets of electronic circuits 104 and 106, when the IC 100 is in the high power mode and is switched off when the IC 100 is in the low power mode. The LPREG 112 provides a second regulated supply voltage to the second set of electronic circuits 106 when the IC 100 is in the low power mode and is switched off when the IC 100 is in the high power mode. In an embodiment of the invention, the voltage regulator system 108 may include an ultra-low power regulator (ULPREG, not shown) that regulates the power supplied to the second set of electronic circuits 106 during the STANDBY mode.

The switch 114 is connected between the HPREG 110 and the second set of electronic circuits 106. The switch 114 connects the HPREG 110 to the second set of electronic circuits 106 when the IC 100 is in the high power mode and disconnects the HPREG 110 and the second set of electronic circuits 106 when the IC 100 is in the low power mode.

The wake-up control system 102 that enables the transition of the IC 100 from the low power mode to the high power mode upon generation of a wake-up request (internally or externally). The wake-up control system 102 includes a wake-up state machine 116, a switch state indicator 118, a low frequency clock source 120, a high frequency clock source 122, a clock multiplexer 124, and a wake-up signal generator 126.

The low frequency clock source 120 generates a low frequency clock signal and the high frequency clock source 122 generates a high frequency clock signal. In an exemplary embodiment of the present invention, the low frequency clock signal may have a frequency of 128 kHz and the high frequency clock signal may have a frequency of 24 MHz. The switch state indicator 118 is connected to the switch 114, and indicates whether the switch 114 is open or closed. The switch state indicator 118 is further connected to the high frequency clock source 122 and enables the high frequency clock source 122 when the switch 114 is closed.

The wake-up signal generator 126 generates a wake-up signal when the IC 100 wakes up from the low power mode. The wake-up signal may be an interrupt signal generated internally or externally that initiates transition of the IC 100 from the low power mode into the high power mode. The wake-up signal generator 126 is connected to the low frequency clock source 120 and enables the low frequency clock source 120 based on the wake-up signal.

The clock multiplexer 124 has a first input terminal connected to the low frequency clock source 120 for receiving the low frequency clock signal, a second input terminal connected to the high frequency clock source 122 for receiving the high frequency clock signal, a select terminal connected to the switch state indicator 118 for receiving a current state of the switch 114, and an output terminal connected to the wake-up state machine 116. The output terminal of the clock multiplexer 124 provides the low frequency clock signal to the wake-up state machine 116 when the switch 114 is open and the high frequency clock signal to the wake-up state machine 116 when the switch 114 is closed.

When the IC 100 transitions from the low power mode to the high power mode (i.e., wakes up from the low power mode), the wake-up signal generator 126 generates the wake-up signal, which in turn enables the low frequency clock source 120 to provide the low frequency clock signal to the wake-up state machine 116. The wake-up state machine 116 begins to operate on the low frequency clock signal and generates a control signal for enabling the HPREG 110. Thereafter, the wake-up state machine 116 waits until the HPREG 110 reaches a first threshold voltage. The first threshold voltage is a minimum voltage required by the HPREG 110 to function in the high power mode. When the HPREG 110 reaches the first threshold voltage, the wake-up state machine 116 generates a control signal to close the switch 114.

After the switch 114 is closed, the switch state indicator 118 enables the high frequency clock source 122 and selects the high frequency clock source 122 for providing the high frequency clock signal to the wake-up state machine 116. Thereafter, the wake-up state machine 116 starts operating on the high frequency clock signal and generates a control signal for disabling the LPREG 112. The wake-up state machine 116 then executes a set of instructions such as wake-up RAM subroutine, for enabling the IC 100 to exit from the low power mode and start operating in the high power mode.

After the switch 114 is closed, the second set of electronic circuits 106 is connected to the HPREG 110, and receives the first regulated supply voltage from the HPREG 110. The HPREG 110 manages the increased current requirement of the high frequency clock source 120. Therefore, the wake-up state machine 116 operates on the high frequency clock signal without the risk of the IC 100 going into a reset. Further, the wake-up state machine 116 operates on the low frequency clock signal for a very small duration of the overall time (wake-up time) required by the IC 100 to transition from the low power mode into the high power mode. Thus, the wake-up time of the IC 100 is not significantly affected by operating the wake-up state machine 116 on the low frequency clock signal until the switch 114 is closed.

Figure 2:
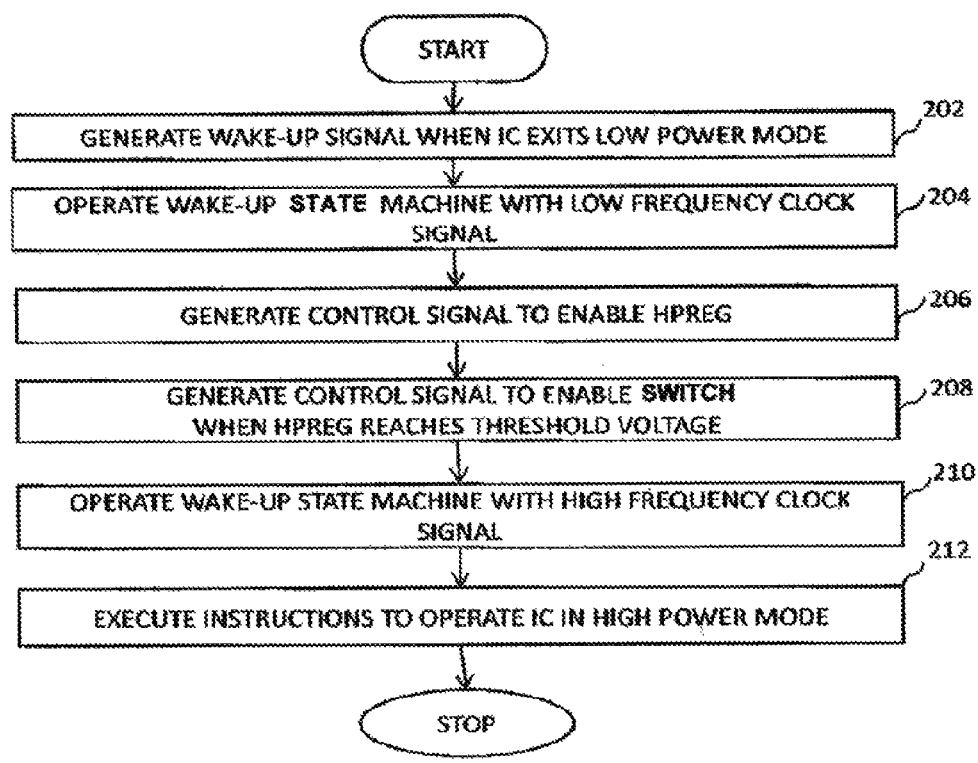
FIG. 2 is a flow chart illustrating a method for waking up an integrated circuit from a low power mode using the wake-up control system in accordance with an embodiment of the present invention.

Referring now to FIG. 2, a flow chart illustrating a method of waking up the IC 100 from the low power mode using the wake-up control system 102 in accordance with an embodiment of the present invention is shown. Steps of the flow chart have been explained in conjunction with FIG. 1.

Initially, the HPREG 110 is switched off and the LPREG 112 generates a second regulated supply voltage, when the IC 100 is in a low power mode. At step 202, a wake-up signal is generated by the wake-up signal generator 126 when the IC 100 exits from the low power mode. At step 204, the wake-up state machine 116 begins to operate on a low frequency clock signal generated based on the wake-up signal. At step 206, a control signal is generated by the wake-up state machine 116 for enabling the HPREG 110. At step 208, another control signal is generated by the wake-up state machine 116 for enabling the switch 114 when the HPREG 110 reaches a first threshold voltage. At step 210, the wake-up state machine 116 begins to operate on a high frequency clock signal generated based on enabling of the switch 114. At step 212, the wake-up state machine 116 executes one or more instructions for enabling the IC 100 to start operating in the high power mode.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The invention claimed is:

1. An integrated circuit, comprising:
   first and second sets of electronic circuits;
   a high power regulator that provides a first regulated supply voltage to the first and second sets of electronic circuits when the integrated circuit is in a high power mode and is switched off when the integrated circuit is in a low power mode;
   a low power regulator that provides a second regulated supply voltage to the second set of electronic circuits when the integrated circuit is in the low power mode and is switched off when the integrated circuit is in the high power mode; and
   a switch, connected between a first shared point of the high power regulator and the first set of electronic circuits, and a second shared point of the low power regulator and the second set of electronic circuits, for connecting the high power regulator to the second set of electronic circuits when the integrated circuit is in the high power mode, and disconnecting the high power regulator from the second set of electronic circuits, and the low power regulator from the first set of electronic circuits when the integrated circuit is in the low power mode, and when the integrated circuit transitions from the low power mode to the high power mode, wherein the second set of electronic circuits includes,
a wake-up control system, connected to the high and low power regulators and the switch, and the wake-up control system includes,
a wake-up state machine that enables the high power regulator when the integrated circuit transitions from the low power mode to the high power mode and closes the switch to connect the high power regulator to the second set of electronic circuits when the high power regulator reaches a first threshold voltage, and
wherein the wake-up state machine operates on a low frequency clock signal when the integrated circuit transitions from the low power mode to the high power mode and the switch is open, and operates on a high frequency clock signal having a frequency that is higher than the frequency of the low frequency clock signal when the switch is closed.

2. The integrated circuit of claim 1, wherein the wake-up control system further comprises a high frequency clock source for generating the high frequency clock signal and a low frequency clock source for generating the low frequency clock signal.

3. The integrated circuit of claim 2, wherein the wake-up control system further comprises a switch state indicator connected to the switch for indicating whether the switch is open or closed, and connected to the high frequency clock source for enabling the high frequency clock source when the switch is closed.

4. The integrated circuit of claim 3, wherein the wake-up control system further comprises a clock multiplexer having a first input terminal connected to the low frequency clock source for receiving the low frequency clock signal, a second input terminal connected to the high frequency clock source for receiving the high frequency clock signal, a select terminal connected to the switch state indicator for receiving a current state of the switch, and an output terminal connected to the wake-up state machine, wherein the clock multiplexer provides the low frequency clock signal to the wake-up state machine when the switch is open and provides the high frequency clock signal to the wake-up state machine when the switch is closed.

5. The integrated circuit of claim 4, wherein the wake-up control system further comprises a wake-up signal generator, connected to the low frequency clock source, for generating a wake-up signal to enable the low frequency clock source when the integrated circuit transitions from the low power mode to the high power mode.

6. The integrated circuit of claim 1, wherein the wake-up state machine disables the low power regulator when the switch is closed.

7. An integrated circuit (IC), comprising:
first and second sets of circuits;
a high power regulator that provides a first regulated supply voltage to the first and second sets of circuits when the IC is in a high power mode and is switched off when the IC is in a low power mode;
a low power regulator that provides a second regulated supply voltage to the second set of circuits when the IC is in the low power mode and is switched off when the IC is in the high power mode; and a switch, connected between a first shared point of the high power regulator and the first set of electronic circuits, and a second shared point of the low power regulator and the second set of circuits, for connecting the high power regulator to the second set of circuits when the IC is in the high power mode, and disconnecting the high power regulator from the second set of circuits, and the low power regulator from the first set of electronic circuits when the IC is in the low power mode, and when the integrated circuit transitions from the low power mode to the high power mode, wherein the second set of circuits includes a wake-up control system connected to the high and low power regulators and the switch, and wherein the wake-up control system includes:
a high frequency clock source for generating a high frequency clock signal and a low frequency clock source for generating a low frequency clock signal having a frequency that is lower than the frequency of the high frequency clock signal;
a switch state indicator, connected to the switch, for indicating whether the switch is open or closed;
a wake-up state machine, that enables the high power regulator when the IC transitions from the low power mode to the high power mode and closes the switch to connect the high power regulator to the second set of circuits when the high power regulator reaches a first threshold voltage, and wherein the wake-up state machine operates on the low frequency clock signal when the IC transitions from the low power mode to the high power mode and the switch is open, and operates on the high frequency clock signal when the switch is closed;
a clock multiplexer having a first input terminal connected to the low frequency clock source for receiving the low frequency clock signal, a second input terminal connected to the high frequency clock source for receiving the high frequency clock signal, a select terminal connected to the switch state indicator for receiving a current state of the switch, and an output terminal connected to the wake-up state machine, wherein the clock multiplexer provides the low frequency clock signal to the wake-up state machine when the switch is open and provides the high frequency clock signal to the wake-up state machine when the switch is closed; and
a wake-up signal generator, connected to the low frequency clock source, for generating a wake-up signal to enable the low frequency clock source when the IC transitions from the low power mode to the high power mode.

8. The IC of claim 7, wherein the switch state indicator is connected to the high frequency clock source for enabling the high frequency clock source when the switch is closed.

9. The IC of claim 7, wherein the wake-up state machine disables the low power regulator when the switch is closed.

10. A wake-up control system of an integrated circuit (IC), wherein the IC includes first and second sets of circuits, high and low power regulators, and a switch connected between a first shared point of the high power regulator and the first set of circuits, and a second shared point of the low power regulator and the second set of circuits, and wherein the wake-up control system is connected to the high power regulator, the low power regulator and the switch, the wake-up control system comprising:
a wake-up state machine that opens the switch to disconnect the first set of circuits from the low power regulator when the IC is in low power mode, and when the integrated circuit transitions from the low power mode to the high power mode, enables the high power regulator when the IC transitions from a low power mode to a high power mode, and closes the switch to connect the high power regulator to the second set of circuits when the high power regulator reaches a first threshold voltage, and wherein the wake-up state machine operates on a low frequency clock signal when the IC transitions from the low power mode to the high power mode and the switch is open, and operates on a high frequency clock signal of which the frequency is higher than the frequency of the low frequency clock signal when the switch is closed.

11. The wake-up control system of claim 10, further comprising a switch state indicator connected to the switch for indicating whether the switch is open or closed and further connected to the high frequency clock source for enabling the high frequency clock source when the switch is closed.

12. The wake-up control system of claim 11, further comprising a high frequency clock source for generating the high frequency clock signal, and a low frequency clock source for generating the low frequency clock signal.

13. The wake-up control system of claim 12, further comprising a clock multiplexer having a first input terminal connected to the low frequency clock source for receiving the low frequency clock signal, a second input terminal connected to the high frequency clock source for receiving the high frequency clock signal, a select terminal connected to the switch state indicator for receiving a current state of the switch, and an output terminal connected to the wake-up state machine, wherein the clock multiplexer provides the low frequency clock signal to the wake-up state machine when the switch is open and provides the high frequency clock signal to the wake-up state machine when the switch is closed.

14. The wake-up control system of claim 12, further comprising a wake-up signal generator, connected to the low frequency clock source, for generating a wake-up signal that enables the low frequency clock source when the IC transitions from the low power mode to the high power mode.

15. The wake-up control system of claim 10, wherein the wake-up state machine disables the low power regulator when the switch is closed.

16. The wake-up control system of claim 10, wherein the wake-up control system resides inside the second set of circuits.

17. The wake-up control system of claim 10, wherein the high power regulator provides a first regulated supply voltage to the first and second sets of circuits when the IC is in the high power mode, and is switched off when the IC is in the low power mode, and wherein the low power regulator provides a second regulated supply voltage to the second set of circuits when the IC is in the low power mode and is switched off when the IC is in the high power mode.

18. The wake-up control system of claim 10, wherein the switch connects the high power regulator to the second set of circuits when the IC is in the high power mode, and disconnects the high power regulator from the second set of circuits when the IC is in the low power mode.

\* \* \* \* \*